United States Patent
Tabata et al.

[11] Patent Number: 5,994,004
[45] Date of Patent: Nov. 30, 1999

[54] LEVENSON TYPE PHASE SHIFT PHOTOMASK AND MANUFACTURE METHOD OF SEMICONDUCTOR DEVICE USING SUCH PHOTOMASK

[75] Inventors: Yasuko Tabata; Satoru Asai; Toshimi Ikeda; Masato Matsumiya, all of Kawasaki, Japan

[73] Assignee: Fujitsu Limited, Kawasaki, Japan

[21] Appl. No.: 09/019,743

[22] Filed: Feb. 6, 1998

[30] Foreign Application Priority Data

Aug. 11, 1997 [JP] Japan ................................. 9-216766

[51] Int. Cl.$^6$ ........................................................ G03F 9/00
[52] U.S. Cl. ................................................................ 430/5
[58] Field of Search ................................ 430/5, 322, 324

[56] References Cited

U.S. PATENT DOCUMENTS 5,546,225  8/1996  Shiraishi ..................................... 430/5

FOREIGN PATENT DOCUMENTS 5-265183  10/1993  Japan .
7-234500  9/1995  Japan .

Primary Examiner—S. Rosasco
Attorney, Agent, or Firm—Armstrong, Westerman, Hattori, McLeland, & Naughton

[57] ABSTRACT

A photomask has a plurality of transparent regions defined in an opaque region and classified into first and second groups. Each of the transparent regions belonging to one of the first and second groups is provided with a phase shifter, so that the phase of light transmitted through the transparent region belonging to the first group becomes different from the phase of light transmitted through the transparent region belonging to the second group. The photomask includes: a pair of first transparent regions belonging to the first group and including linear portions disposed in parallel, a virtual straight line interconnecting one ends of the first transparent regions intersecting at a right angle with the extension direction of the linear portions; and a second transparent region belonging to the second group and disposed at the center between, and in parallel to, the linear portions of the pair of first transparent regions, the second transparent region including a linear thickportion and a linear thin portion, the linear thin portion being disposed in an area between the pair of first transparent regions and continuously coupled to the linear thick portion, and a connection portion between the thick and thin portions being indented from the virtual straight line toward the area between the pair of first transparent regions.

13 Claims, 6 Drawing Sheets

LEVENSON TYPE PHASE SHIFT PHOTOMASK AND MANUFACTURE METHOD OF SEMICONDUCTOR DEVICE USING SUCH PHOTOMASK

This application is based on Japanese Patent Application No. HEI 9-216766 filed on Aug. 11, 1997, the entire contents of which are incorporated herein by reference.

BACKGROUND OF THE INVENTION a) Field of the Invention

The present invention generally relates to a photomask to be used in a photolithography process of semiconductor device manufacture, and to a method of manufacturing a semiconductor device by using such a photomask. The invention specifically relates to a phase shift type photomask and a method of manufacturing a semiconductor device using such a phase shift type photomask.

b) Description of the Related Art

In a Levenson type phase shift photomask, a phase shifter is disposed at one of each pair of adjacent transparent regions. Light transmitted through the transparent region provided with the phase shifter has a phase shift of, for example, 180° relative to light transmitted through the transparent region not provided with the phase shifter. Therefore, the intensity of light exposed on a semiconductor substrate is lowered by light interference at the middle of substrate regions corresponding to each pair of transparent regions. In this manner, a resolution of adjacent bright regions can be improved.

By using a Levenson type phase shift photomask, resolution at the area where the same pattern is regularly repeated can be improved. However, in a practical semiconductor integrated circuit device, not only regularly repeated patterns but also irregular patterns or isolated patterns from nearby patterns are used. There are also connection areas between regular patterns and irregular patterns or isolated patterns.

A sufficient resolution may not be obtained at connection areas between regular patterns and irregular patterns or isolated patterns.

SUMMARY OF THE INVENTION

It is an object of the present invention to provide a photomask which can transfer a good pattern image for any pattern layout.

It is another object of the present invention to provide a method of manufacturing a semiconductor device by using a photomask as above.

According to one aspect of the present invention, there is provided a photomask with a plurality of transparent regions defined in an opaque region and classified into first and second groups, the phase of light transmitted through the transparent region belonging to the first group being different from the phase of light transmitted through the transparent region belonging to the second group, comprising: at least one pair of first transparent regions belonging to the first group and including linear portions disposed in parallel, a virtual straight line interconnecting one of the ends of the first transparent regions intersecting at a right angle with the extension direction of the linear portions; and a second transparent region belonging to the second group and disposed at the center between, and in parallel to, the linear portions of the pair of first transparent regions, the second transparent region including a linear thick portion and a linear thin portion, the linear thin portion being disposed in an area between the pair of first transparent regions and continuously coupled to the linear thick portion, and a connection portion between the thick and thin portions being indented from the virtual straight line toward the area between the pair of first transparent regions.

The connection portion between the thick and thin portions of the second transparent region is indented from the virtual straight line toward the area between the pair of first transparent regions. It is therefore possible to suppress the thinning of the resist pattern corresponding to this area.

According to another aspect of the present invention, there is provided a photomask with a plurality of transparent regions defined in an opaque region and classified into first and second groups, the phase of light transmitted through the transparent region belonging to the first group being different from the phase of light transmitted through the transparent region belonging to the second group, comprising: a pair of first transparent regions belonging to the first group and including linear portions disposed in parallel to the x-axis direction of an x-y rectangular coordinate system defined in the plane of the photomask; and a second transparent region belonging to the second group and including an x-axis direction extending portion and a y-axis direction extending portion, the x-axis direction extending portion being disposed in parallel to the x-axis direction and at the center between the linear portions of the pair of first transparent regions, the y-axis direction extending portion bending near at one end of the one of the first transparent regions, from the x-axis direction extending portion toward one of the first transparent regions, and extending in the y-axis direction, and a space between the y-axis direction extending portion and the one of the first transparent regions being generally equal to a space between the x-axis direction extending portion and the linear portion of the first transparent region.

By setting the space between the y-axis direction extending portion and one of the first transparent regions generally equal to the space between the x-axis direction extending portion and the first transparent region, the thinning of the resist pattern near at the bending point of the x-axis direction extending portion can be suppressed.

According to still another aspect of the present invention, there is provided a photomask with a plurality of transparent regions defined in an opaque region and classified into first and second groups, the phase of light transmitted through the transparent region belonging to the first group being different from the phase of light transmitted through the transparent region belonging to the second group, and a shortest space between transparent regions belonging to the same group being set to a minimum design space Se, comprising: a first pattern including a plurality of transparent regions belonging to the first group and having elongated portions in the x-axis direction of an x-y rectangular coordinate system defined in the plane of the photomask and a plurality of transparent regions belonging to the second group and having elongated portions in the x-axis direction, the transparent regions belonging to the first and second groups being disposed alternately in the y-axis direction at a space Sn narrower than the minimum design space Se; and a second pattern of the transparent region belonging to the first group and disposed facing one ends of at least two adjacent transparent regions among the transparent regions of the first pattern, wherein of at least the two adjacent transparent regions facing the second pattern, in one of the two adjacent transparent regions belonging to the second group, a space between one end of the one transparent region and the second pattern is designed to be equal to the space Sn, and in the other of the two adjacent transparent regions belonging to the first group, a space between one end of the other transparent region and the second pattern is designed to be narrower than the minimum design space Se.

Although the transparent region of the first pattern and the second pattern belong to the same first group, the space therebetween is made narrower than the minimum design space Se. Accordingly, one end of the resist pattern corresponding to the one end of the transparent region of the first pattern belonging to the first group can be suppressed from being further retracted.

According to another aspect of the present invention, there is provided a method of manufacturing a semiconductor device comprising the steps of: preparing a semiconductor substrate with a photosensitive resist film formed on the surface thereof; exposing the resist film by using a photomask as described above; developing the resist film and leaving a resist pattern; and processing the surface or a surface layer of the semiconductor substrate by using the left resist pattern.

By using such the photomask described above, a constriction and breakage of a resist pattern can be suppressed, and a desired pattern region on the surface of a semiconductor device can be processed reliably.

As described in the above, in a photomask with phase shifters, the influence of a constriction of a resist pattern or a retraction of an end of an elongated resist pattern to be formed near at the boundary between two regions having different layout design rules, can be reduced.

DETAILED DESCRIPTION OF THE PREFERRED EMBODIMENTS

Preliminary experiments made by the present inventors will be described prior to describing the first embodiment of the invention.

Figure 1:
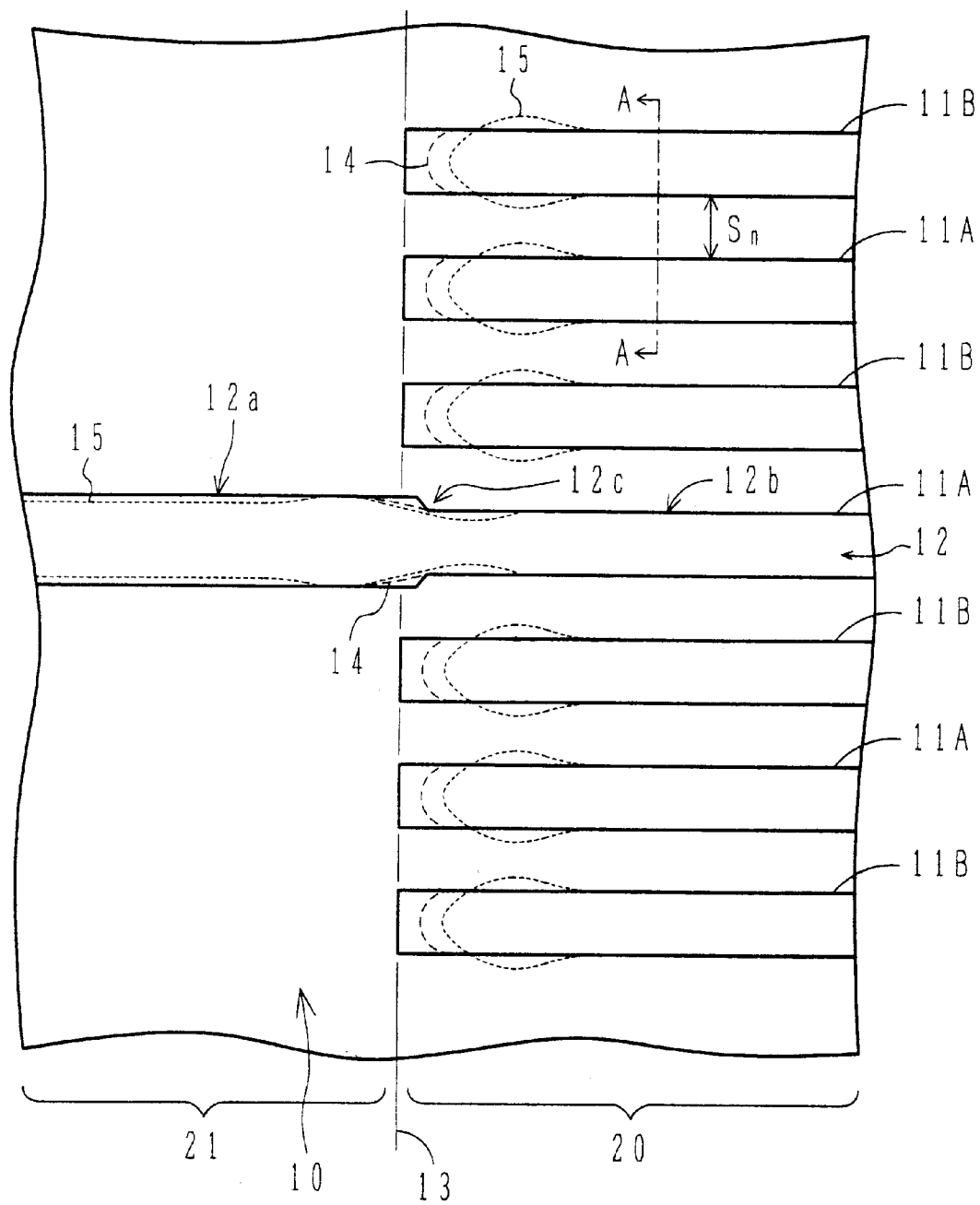
FIG. 1 is a partial plan view of a photomask according to a first embodiment of the invention.
Figure 2A:
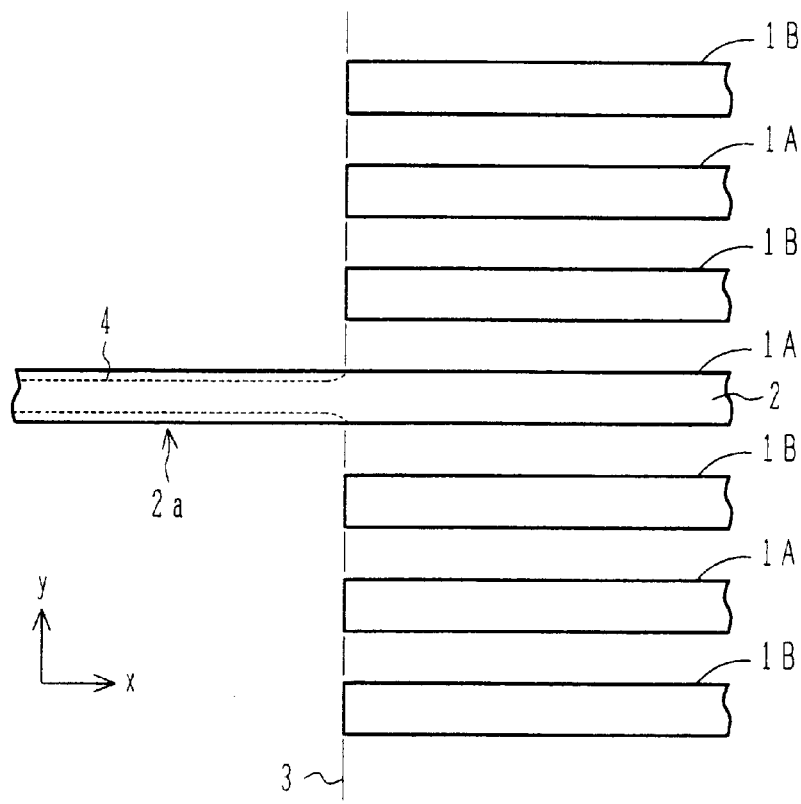
FIGS. 2A and 2B are partial plan views of photomasks used for evaluation of preliminary experiments.

FIG. 2A shows an example of patterns of a conventional Levenson type photomask. Consider an x-y rectangular coordinate system defined in the plane of the photomask. In an opaque region, a plurality of transparent regions 1A and 1B extending laterally in the y-axis direction are defined. The transparent regions 1A and 1B are alternately disposed in the x-axis direction, with a space of 0.2 $\mu$m therebetween. Each transparent region, for example, each transparent region 1A, is provided with a phase shifter for delaying the phase of exposure light by 180°. The width of each of the transparent regions 1A and 1B is 0.2 $\mu$m. The left side ends of the transparent regions 1A and 1B as viewed in FIG. 1A are aligned on a virtual straight line 3 parallel to the y-axis.

Of the transparent regions 1a, a transparent region 2 extends to the left of the virtual straight line 3. The width of the extended portion 2a is 0.2 $\mu$m same as that of the transparent regions 1A and 1B alternately disposed.

By using this photomask, a resist film formed on the surface of a semiconductor substrate is exposed, developed and patterned. The obtained resist pattern becomes thin at the extended portion 2a as indicated by broken lines 4 in FIG. 2A. The thinning degree becomes greater as the exposure defocussing amount increases.

Figure 2B:
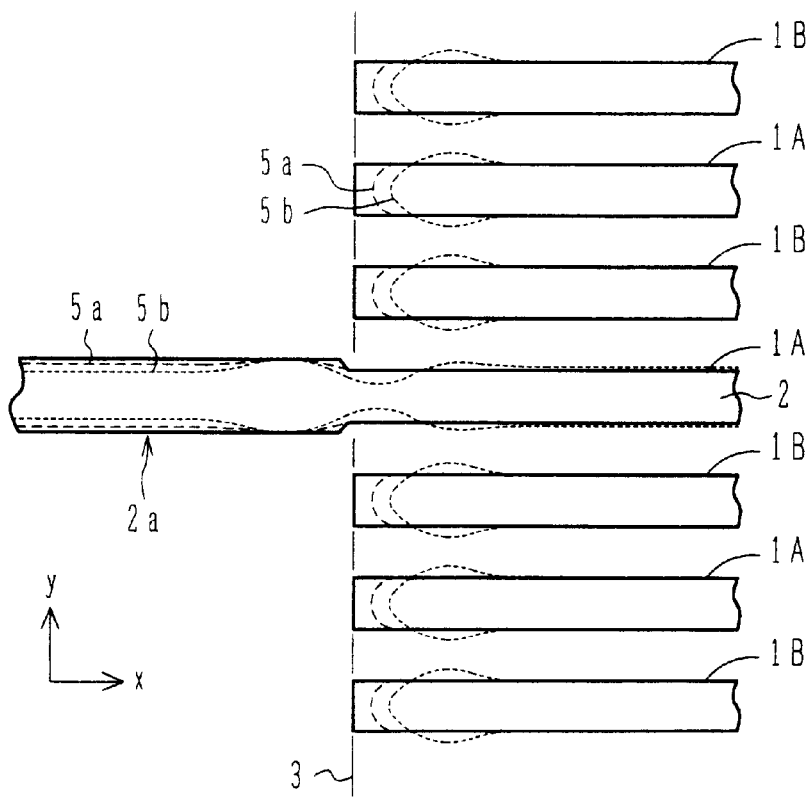

FIG. 2B shows another example of patterns with the extended portion 2a shown in FIG. 2A being set to 0.3 $\mu$m. The other structures are the same as the patterns shown in FIG. 2A. The contour of a resist pattern formed through exposure by using this photomask and predicted through light intensity simulation is indicated by broken lines 5a and dotted lines 5b in FIG. 2B. The broken lines 5a correspond to the best focus, and the dotted lines 5b correspond to a defocus of 0.4 $\mu$m. This simulation was performed on the assumption of an exposure wavelength of 248 nm, a projecting lens numerical aperture of 0.6 and an $\delta$ value of 0.4 indicating the size of a light source.

At the best focus, the resist pattern at the extended portion 2a thins slightly, which is approximately equal to the width of the transparent region in an area where the transparent regions 1A and 1B are alternately disposed. In contrast, in the defocus state, the portion near at the connection area between the extended portion 2a of the transparent region 1A and the portion at the right of the virtual straight line 3 in the alternately disposed area has a constriction. This constriction may cause a breakage of a wiring pattern.

Next, the first embodiment of the invention will be described with reference to FIG. 1.

FIG. 1 is a partial plan view of a photomask according to the first embodiment. In an opaque region 10, a plurality of transparent regions 11A and 11B extending laterally in FIG. 1 are defined. The plurality of transparent regions are classified into two groups depending upon whether the transparent region has a phase shifter. The transparent region belonging to the first group has the phase shifter, whereas the transparent region belonging to the second group has no phase shifter. Therefore, light transmitted through the transparent region belonging to the first group has a phase difference, for example, 180° from that of light transmitted through the transparent region belonging to the second group. In the example shown in FIG. 1, the transparent region 11A belongs to the first group and the transparent region 11B belongs to the second group.

Figure 6:
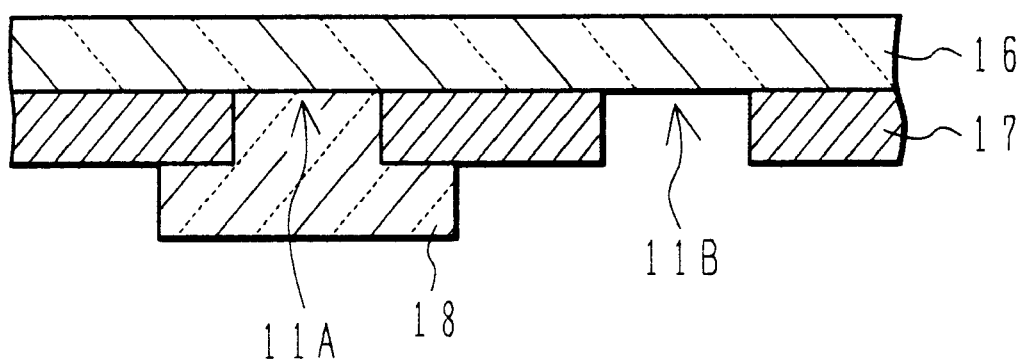
FIG. 6 is a partial cross sectional view showing an example of the structure of a photomask used by the embodiment.

FIG. 6 is a cross sectional view taken along one-dot chain line A—A in FIG. 1. On the surface of a support substrate which transmits exposure light therethrough, a light shielding pattern 17 is formed which defines the transparent regions 11A and 11B. A phase shifter 18 is formed covering the transparent region 11A and the end portions of its nearby light shielding pattern 17. The phase of light transmitting through the transparent region 11A and propagating through the phase shifter 18 delays from the phase of light transmitting through the transparent region 11B and propagating through atmospheric air. By adjusting the refractive index and thickness of the phase shifter, the phase delay amount can be controlled. Instead of using the phase shifter 18, a recess may be formed in the support substrate at an area corresponding to the transparent region 11B to change the thicknesses of the support substrate at the transparent regions 11A and 11B.

In the repetitive pattern region 20 in the right half area of FIG. 1, the transparent regions 11A and 11B respectively belonging to the first and second groups are alternately disposed at an equal space in the vertical direction in FIG. 1. The right side ends of the transparent regions 11A excepting one transparent region 12 and those of the transparent regions 12 are aligned on a virtual straight line 13 intersecting at a right angle with the extension direction of the transparent regions 11A and 11B.

The transparent region 12 is constituted of a thick portion 12a disposed in a coarse pattern region 21 generally to the left of the virtual straight line 13 and a thin portion 12b disposed in the repetitive pattern region 20 generally to the right of the virtual straight line 13. The connection portion 12c between the thick portion 12a and thin portion 12b slightly indents toward the repetitive pattern region 20.

The predicted contour of a resist pattern was calculated through simulation under the conditions that the minimum design space Sn between two adjacent transparent regions of the different groups was 0.2 μm. The space between adjacent transparent regions 11A and 11B was therefore set to the minimum design space of 0.2 μm. The widths of the transparent regions 11A excepting the transparent region 12 and those of the transparent regions 11B were set to 0.2 μm, the width of the thick portion 12a of the transparent region 12 was set to 0.3 μm, the width of the thin portion 12b was set to 0.2 μm, and the depth of the connection portion 12c indented toward the repetitive pattern region 20 from the virtual straight line 13 was set to 0.1 μm.

The contour of the resist pattern predicted from light intensity simulation when this photomask is used is shown by broken lines 14 and dotted lines 15 in FIG. 1. The contour indicated by the broken lines corresponds to the best focus, and the contour indicated by the dotted lines 15 corresponds to a defocus by 0.4 μm. The simulation was performed under the conditions of an exposure wavelength of 248 nm, a projecting lens numerical aperture of 0.6 and an δ value of 0.4 indicating the size of a light source.

In the defocus state, a constriction near the connection portion 12c is less than that shown in FIG. 2B. By indenting the connection portion 12c toward the repetitive pattern portion 20 in the above manner, it becomes possible to alleviate the constriction of the resist pattern near the boundary of the repetitive pattern region 20.

In the example shown in FIG. 1, the transparent regions 11A belonging to the first group and the transparent regions 11B belonging to the second group are respectively provided more than three in the repetitive pattern region 20. The advantageous effects of the first embodiment may be expected even for the case where only the transparent region 12 shown in FIG. 1 is provided as the region belonging to the first group and a single pair of transparent regions 12 belonging to the second group is disposed on both sides of the single transparent region 12.

In the example shown in FIG. 1, the depth of the connection portion 12c indented toward the repetitive pattern region 20 is set to 0.1 μm. This depth may be changed. However, in order to ensure sufficient effects of alleviating the pattern constriction, it is preferable to set the indented depth to one fourth of the space between adjacent transparent regions 11A and 11B. In order to obtain a resolution between the thick portion 12a of the transparent region 12 and the adjacent transparent regions 11B, it is preferable to set the indented depth to one half of the space or shallower.

Next, a modification of the first embodiment will be described with reference to FIG. 3.

Figure 3:
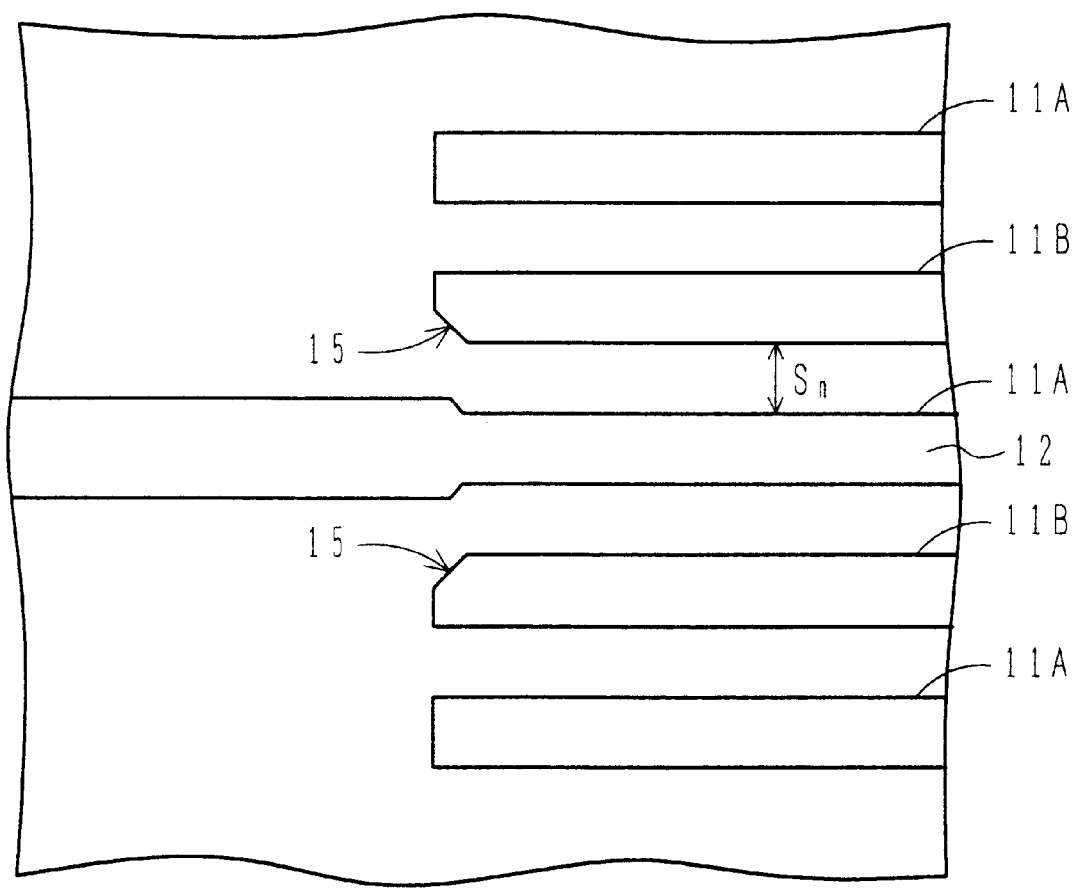
FIG. 3 is a partial plan view of a photomask according to a modification of the first embodiment of the invention.

FIG. 3 is a partial plan view of a photomask according to the modification of the first embodiment. Different points from the photomask of the first embodiment shown in FIG. 1 will be mainly described.

A recess 15 is formed at the corner of each of a pair of transparent regions 11b adjacent to the transparent region 12, the corner being one of two corners near the transparent region 12. The recess 15 is formed so that the shortest distance between the transparent region 12 and two opposing transparent regions 11B is not shorter than the minimum design space Sn.

In the example shown in FIG. 1, the distance between the thick portion 12a and two opposing transparent regions 11B becomes shorter than the minimum design space Sn near at the connection portion 12c of the transparent region 12. With this photomask pattern, the area narrower than the minimum design space Sn is detected as an error at a design verification process after the photomask pattern is designed. It is difficult to automatically discriminate this detected error between an error caused by the connection portion 12c indented toward the repetitive pattern region 20 and an error caused by pattern design.

In the modification shown in FIG. 3, the connection portion 12c indented toward the repetitive pattern region 20 is not detected as an error so that it becomes possible to automatically discriminate an error caused by pattern design from other errors.

In the example shown in FIG. 3, the recess 15 formed at the corner of the transparent region 11B has a straight side. The recess 15 may have a different shape so long as the shortest distance between the transparent region 12 and two opposing transparent regions 11B is not shorter than the minimum design space.

Next, the second embodiment of the invention will be described with reference to FIG. 4.

Figure 4:
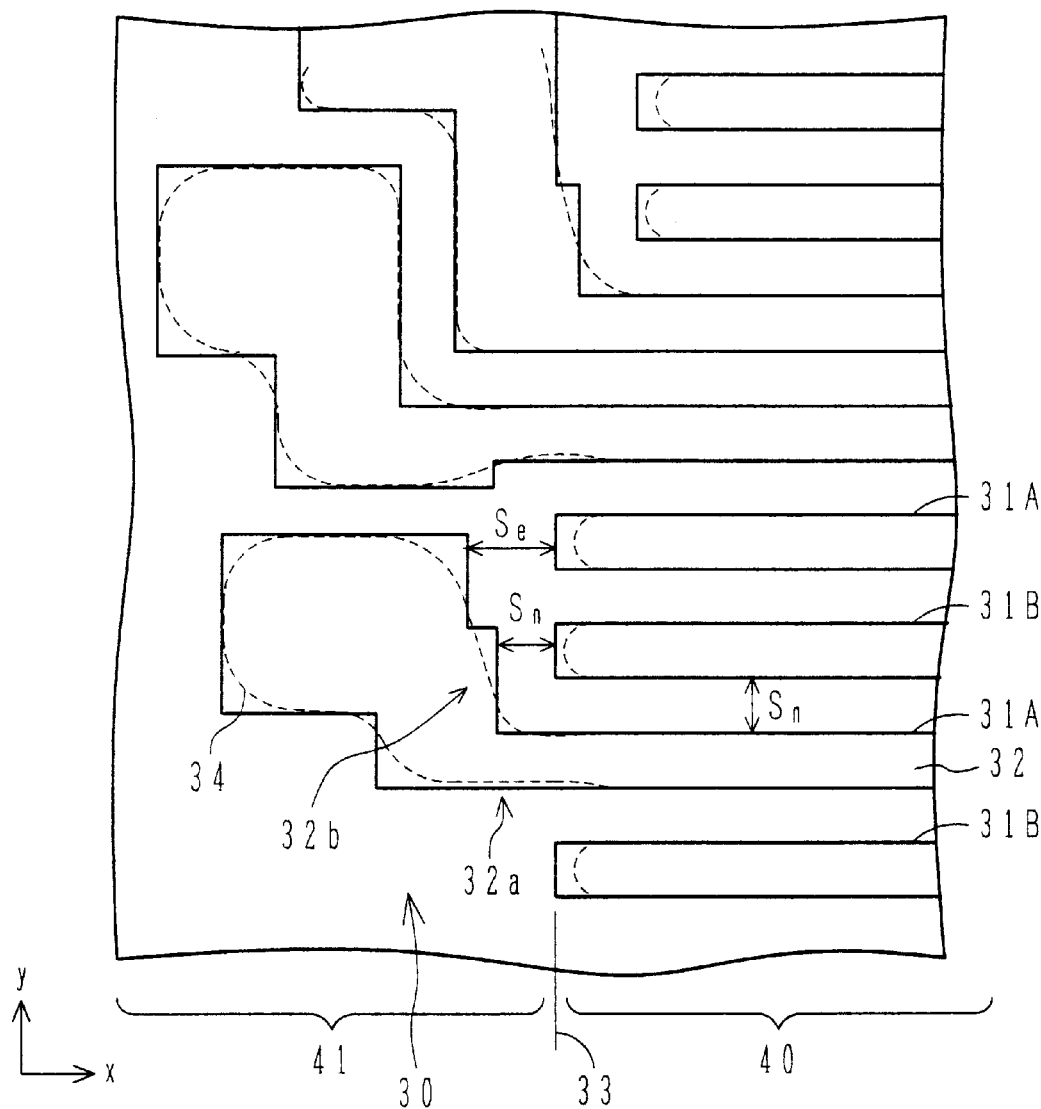
FIG. 4 is a partial plan view of a photomask according to a second embodiment of the invention.

FIG. 4 is a partial plan view of a photomask of the second embodiment. In an opaque region 30, a plurality of transparent regions 31A and 31B are defined. Similar to the first embodiment shown in FIG. 1, the plurality of transparent regions 31A and 31B are classified into first and second groups, depending upon a presence/absence of a phase shifter. For example, the transparent regions 31A belong to the first group and the transparent regions 31B belong to the second group.

Consider an x-y rectangular coordinate system defined in the plane of the photomask. In an area 40 to the right of a virtual straight line 33 parallel to the y-axis, the transparent regions 31A and 31B extending in the x-axis direction are disposed alternately in the y-axis direction and regularly at an equal space. A space between adjacent transparent regions 31A and 31B is equal to the minimum design space Sn between two adjacent transparent regions belonging to the different groups. The left side ends of the transparent regions 31A except one transparent region 32 and those of the transparent regions 31B are aligned on the virtual straight line 33.

The transparent region 32 extends into a coarse pattern region 41 to the left of the virtual straight line 33, and are bent upward in a region 41. A width of an x-direction extending portion 32a is constant, this portion being constituted of a portion of the transparent region 32 from the virtual straight line 33 to the bent position and a portion thereof in the repetitive pattern region 40. A y-direction extending portion 32b bending and extending upward partially faces the left side ends of the transparent region 31B next to the transparent region 32 and the transparent region 31A next to the transparent region 31B.

In an area of the y-direction extending portion 32b facing the transparent region 31B, the space between the y-direction extending portion 32b and the transparent region 31B is set to the minimum design space Sn. In an area of the y-direction extending portion 32b facing the transparent region 31A, the space between the y-direction extending portion 32b and the transparent region 31A is set to a minimum design space Se between the two adjacent transparent regions belonging to the same group.

If the space between the y-direction extending portion 32b and the transparent region 31B is made wide, the width of a resist pattern corresponding to the x-direction extending portion 32a of the transparent region 32 becomes narrow in the coarse pattern region 41, as discussed with FIG. 2A. In addition, as discussed with FIG. 2B, a constriction is formed in the defocus state near at the cross point between the resist pattern corresponding to the transparent region 32 and the virtual straight line 33.

By setting the space between the y-direction extending portion 32b and the transparent region 31B next to the transparent region 32 to the minimum design space Sn, the resist pattern corresponding to the x-direction extending portion 32a in the coarse pattern region 41 can be prevented from being thinned, and a constriction can be prevented from being formed near at the cross point between the resist pattern and the virtual straight lie 33.

The contour of the resist pattern predicted from light intensity simulation when this photomask is used is shown by broken lines 34 in FIG. 4. The minimum design space Sn was 0.2 μm and the minimum design space Se was 0.3 μm. The simulation was performed under the same conditions as the first embodiment shown in FIG. 1. As seen from the predicted contour shown in FIG. 4, it is possible to form a good resist pattern while the thinning of the resist pattern corresponding to the x-direction extending portion 32a is suppressed.

Next, the third embodiment of the invention will be described with reference to FIGS. 5A and 5B.

Figure 5A:
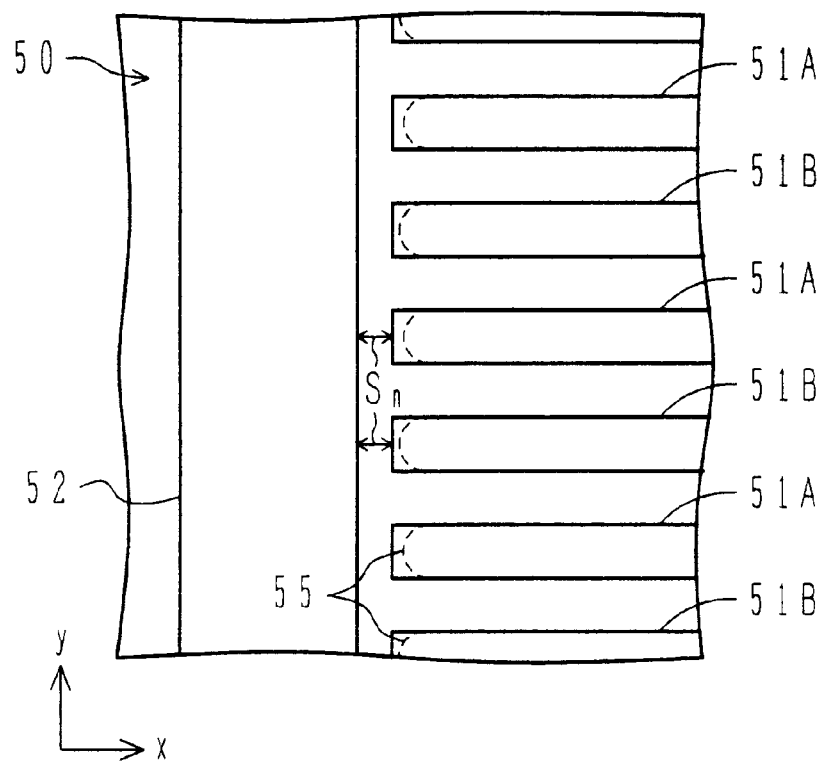
FIGS. 5A and 5B are partial plan views of a photomask according to a third embodiment of the invention and a photomask used for comparison respectively.

FIG. 5A is a partial plan view of a photomask according to the third embodiment. In an opaque region 50, a plurality of transparent regions 51A and 51B are defined. The plurality of transparent regions are classified into two groups depending upon whether the transparent region has a phase shifter, similar to the first embodiment shown in FIG. 1. The photomask shown in FIG. 5A is designed with the minimum design space Se between two transparent regions belonging to the same group and with the minimum design space Sn between two transparent regions belonging to the different groups. Consider now an x-y rectangular coordinate system defined in the plane of the photomask.

A plurality of transparent regions 51A and 51B respectively belonging to the first and second groups and extending in the x-axis direction are alternately disposed in the y-axis direction at a space of 0.28 μm. The width of each of the regions 51A and 51B is 0.28 μm.

A transparent region 52 belonging to the first group is disposed facing one ends of the transparent regions 51A and 51B. A space between one ends of the transparent regions 51B and the transparent region 52 is set to the minimum design space Sn on the basis of design rule. Although a space between one ends of the transparent regions 51A and the transparent region 52 is the minimum design space Se if design rule is obeyed, it is exceptionally set equal to the minimum design space Sn.

A resist pattern exposed with this photomask is likely to retract at one ends of the elongated transparent regions 51A and 51B if the width of each of the regions is 0.7×λ/NA or narrower, where λ is an exposure wavelength and NA is a numerical aperture of the projecting lens. The contour of the resist pattern predicted from light intensity simulation when this photomask is used is shown by broken lines 55 in FIG. 5A. The exposure wavelength is 248 nm and the NA of the projecting lens is 0.6.

Figure 5B:
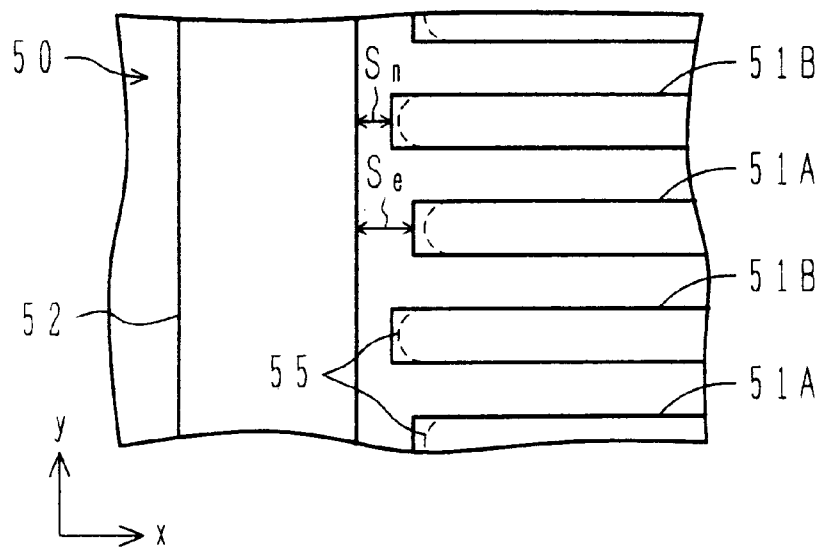

FIG. 5B shows a photomask designed by obeying design rule with the minimum design space Se between one ends of the transparent regions 51A and the transparent region 52. The width of, and space between, the transparent regions 51A and 51B are 0.28 μm. As indicated by broken lines in FIG. 5B, one ends of the resist patterns corresponding to the transparent regions 51A belonging to the same group as the transparent region 52 are retracted more than the transparent regions 51B.

This retraction of one ends of the resist patterns corresponding to the transparent regions 51A can be suppressed by setting the space between one ends of the transparent regions 51a and the transparent region 52 near to the minimum design space Sn between transparent regions belonging to the different groups. In the example shown in FIG. 5A, the space between one ends of the transparent regions 51A and the transparent region 52 is set to the minimum design space Sn. This space may be set in a range from the minimum design space Sn or wider and to the minimum design space Se or narrower, with some advantageous effects as above being expected.

The present invention has been described in connection with the preferred embodiments. The invention is not limited only to the above embodiments. It is apparent that various modifications, improvements, combinations, and the like can be made by those skilled in the art.

What is claimed is:

1. A photomask with a plurality of transparent regions defined in an opaque region and classified into first and second groups, the phase of light transmitted through the transparent region belonging to the first group being different from the phase of light transmitted through the transparent region belonging to the second group, comprising:

at least one pair of first transparent regions belonging to the first group and including linear portions disposed in parallel, a virtual straight line interconnecting one of the ends of the first transparent regions intersecting at a right angle with the extension direction of the linear portions; and a second transparent region belonging to the second group and disposed at the center between, and in parallel to, the linear portions of the pair of first transparent regions, the second transparent region including a linear thick portion and a linear thin portion, the linear thin portion being disposed in an area between the pair of first transparent regions and continuously coupled to the linear thick portion, and a connection portion between the thick and thin portions being indented from the virtual straight line toward the area between the pair of first transparent regions.

2. A photomask according to claim 1, wherein each of the first transparent regions includes a recess formed at a corner of one end on the side of the second transparent regions, so that a space between each of the first transparent region and the thick portion of the second transparent region is shorter than a space between each of the first transparent regions and the thin portion of the first transparent region.

3. A photomask according to claim 1, wherein a depth of the connection portion between the thick and thin portions indented from the virtual straight line toward the area between the pair of first transparent regions, is one fourth of a space between the first transparent region and the thin portion of the second transparent region or deeper.

4. A photomask according to claim 2, wherein a depth of the connection portion between the thick and thin portions indented from the virtual straight line toward the area between the pair of first transparent regions, is one fourth of a space between the first transparent region and the thin portion of the second transparent region or deeper.

5. A photomask according to claim 1, wherein the phase of light transmitted through the transparent region belonging to the first group is different from the phase of light transmitted through the transparent region belonging to the second group by 180 degree.

6. A photomask with a plurality of transparent regions defined in an opaque region and classified into first and second groups, the phase of light transmitted through the transparent region belonging to the first group being different from the phase of light transmitted through the transparent region belonging to the second group, comprising:

a pair of first transparent regions belonging to the first group and including linear portions disposed in parallel to the x-axis direction of an x-y rectangular coordinate system defined in the plane of the photomask; and a second transparent region belonging to the second group and including an x-axis direction extending portion and a y-axis direction extending portion, the x-axis direction extending portion being disposed in parallel to the x-axis direction and at the center between the linear portions of the pair of first transparent regions, the y-axis direction extending portion bending near at one end of the one of the first transparent regions, from the x-axis direction extending portion toward one of the first transparent regions, and extending in the y-axis direction, and a space between the y-axis direction extending portion and the one of the first transparent regions being generally equal to a space between the x-axis direction extending portion and the linear portion of the first transparent region.

7. A photomask according to claim 6, wherein the phase of light transmitted through the transparent region belonging to the first group is different from the phase of light transmitted through the transparent region belonging to the second group by 180 degree.

8. A photomask with a plurality of transparent regions defined in an opaque region and classified into first and second groups, the phase of light transmitted through the transparent region belonging to the first group being different from the phase of light transmitted through the transparent region belonging to the second group, and a shortest space between transparent regions belonging to the same group being set to a minimum design space Se, comprising:

a first pattern including a plurality of transparent regions belonging to the first group and having elongated portions in the x-axis direction of an x-y rectangular coordinate system defined in the plane of the photomask and a plurality of transparent regions belonging to the second group and having elongated portions in the x-axis direction, the transparent regions belonging to the first and second groups being disposed alternately in the y-axis direction at a space Sn narrower than the minimum design space Se; and a second pattern of the transparent region belonging to the first group and disposed facing one ends of at least two adjacent transparent regions among the transparent regions of the first pattern, wherein of at least the two adjacent transparent regions facing the second pattern, in one of the two adjacent transparent regions belonging to the second group, a space between one end of the one transparent region and the second pattern is designed to be equal to the space Sn, and in the other of the two adjacent transparent regions belonging to the first group, a space between one end of the other transparent region and the second pattern is designed to be narrower than the minimum design space Se.

9. A photomask according to claim 8, wherein the phase of light transmitted through the transparent region belonging to the first group is different from the phase of light transmitted through the transparent region belonging to the second group by 180 degree.

10. A photomask according to claim 8, wherein the space Sn is a minimum design space between the transparent regions belonging to the different groups.

11. A method of manufacturing a semiconductor device comprising the steps of:

preparing a semiconductor substrate with a photosensitive resist film formed on the surface thereof;

exposing the resist film by using a photomask;

developing the resist film and leaving a resist pattern; and processing the surface or a surface layer of the semiconductor substrate by using the left resist pattern, wherein the photomask including a plurality of transparent regions defined in an opaque region and classified into first and second groups, the phase of light transmitted through the transparent region belonging to the first group being different from the phase of light transmitted through the transparent region belonging to the second group, comprises:

at least one pair of first transparent regions belonging to the first group and including linear portions disposed in parallel, a virtual straight line interconnecting one of the ends of the first transparent regions intersecting at a right angle with the extension direction of the linear portions; and a second transparent region belonging to the second group and disposed at the center between, and in parallel to, the linear portions of the pair of first transparent regions, the second transparent region including a linear thick portion and a linear thin portion, the linear thin portion being disposed in an area between the pair of first transparent regions and continuously coupled to the linear thick portion, and a connection portion between the thick and thin portions being indented from the virtual straight line toward the area between the pair of first transparent regions.

12. A method of manufacturing a semiconductor device comprising the steps of:

preparing a semiconductor substrate with a photosensitive resist film formed on the surface thereof;

exposing the resist film by using a photomask;

developing the resist film and leaving a resist pattern; and processing the surface or a surface layer of the semiconductor substrate by using the left resist pattern, wherein the photomask including a plurality of transparent regions defined in an opaque region and classified into first and second groups, the phase of light transmitted through the transparent region belonging to the first group being different from the phase of light transmitted through the transparent region belonging to the second group, comprises:

a pair of first transparent regions belonging to the first group and including linear portions disposed in parallel to the x-axis direction of an x-y rectangular coordinate system defined in the plane of the photomask; and a second transparent region belonging to the second group and including an x-axis direction extending portion and a y-axis direction extending portion, the x-axis direction extending portion being disposed in parallel to the x-axis direction and at the center between the linear portions of the pair of first transparent regions, the y-axis direction extending portion bending near at one end of the one of the first transparent regions, from the x-axis direction extending portion toward one of the first transparent regions, and extending in the y-axis direction, and a space between the y-axis direction extending portion and the one of the first transparent regions being generally equal to a space between the x-axis direction extending portion and the linear portion of the first transparent region.

13. A method of manufacturing a semiconductor device comprising the steps of:

preparing a semiconductor substrate with a photosensitive resist film formed on the surface thereof;

exposing the resist film by using a photomask;

developing the resist film and leaving a resist pattern; and processing the surface or a surface layer of the semiconductor substrate by using the left resist pattern, wherein the photomask including a plurality of transparent regions defined in an opaque region and classified into first and second groups, the phase of light transmitted through the transparent region belonging to the first group being different from the phase of light transmitted through the transparent region belonging to the second group, and a shortest space between transparent regions belonging to the same group being set to a minimum design space Se, comprises:

a first pattern including a plurality of transparent regions belonging to the first group and having elongated portions in the x-axis direction of an x-y rectangular coordinate system defined in the plane of the photomask and a plurality of transparent regions belonging to the second group and having elongated portions in the x-axis direction, the transparent regions belonging to the first and second groups being disposed alternately in the y-axis direction at a space Sn narrower than the minimum design space Se; and a second pattern of the transparent region belonging to the first group and disposed facing one ends of at least two adjacent transparent regions among the transparent regions of the first pattern, wherein of at least the two adjacent transparent regions facing the second pattern, in one of the two adjacent transparent regions belonging to the second group, a space between one end of the one transparent region and the second pattern is designed to be equal to the space Sn, and in the other of the two adjacent transparent regions belonging to the first group, a space between one end of the other transparent region and the second pattern is designed to be narrower than the minimum design space Se.

* * * * *